United States Patent [19]

Barry et al.

[11] 4,383,318

[45] May 10, 1983

[54] LASER PUMPING SYSTEM

[75] Inventors: James D. Barry; Arthur J. Einhorn, both of Los Angeles, Calif.

[73] Assignee: Hughes Aircraft Company, Culver City, Calif.

[21] Appl. No.: 216,348

[22] Filed: Dec. 15, 1980

[51] Int. Cl.³ .............................................. H01S 3/09
[52] U.S. Cl. ....................................... 372/6; 372/70; 350/96.24
[58] Field of Search .................... 372/6, 70; 350/96.24

[56] References Cited

U.S. PATENT DOCUMENTS 3,471,215  9/1969  Snitzer .................................. 372/6

OTHER PUBLICATIONS

"Optical Pumping System" by Hardy; *IBM Tech. Disclosure Bull.*, vol. 6, No. 8, Jan. 1964.

*Primary Examiner*—William L. Sikes
*Assistant Examiner*—Léon Scott, Jr.
*Attorney, Agent, or Firm*—William J. Benman, Jr.; William H. MacAllister; Anthony W. Karambelas

[57] ABSTRACT

An improved laser pumping system is provided which utilizes optic fibers configured in a fan-in arrangement and an array of light emitting diodes or diode lasers to which the optic fibers are connected for concentrating light energy on a lasing medium. The improvement is an increase of the amount of light energy that can be applied to the laser within a fixed volume.

3 Claims, 4 Drawing Figures

LASER PUMPING SYSTEM

BACKGROUND OF THE INVENTION

1. Field of the Invention

This invention relates to laser systems. More specifically, this invention relates to improvements in the pumping of lasers which may be excited by light emitting diodes and diode lasers.

While the present invention is described herein with reference to a particular application, it should be understood that the invention is not limited thereto. The teachings of the present invention may be adapted and employed for a variety of requirements as those skilled in the art will recognize in light of the present disclosure.

2. Description of the Prior Art

A diode-pumped neodymium yttrium alluminum garnet (hereafter Nd:YAG) laser is under consideration for use in space optical communications because it offers the advantages of compactness and efficiency while not requiring the power supply of an excitation lamp or the solar tracking optical assembly of a typical solar pumping scheme. The light-emitting diode and the injection laser diode both offer a high brightness, wavelength selectable source which may be efficiently coupled to the absorption bands of the Nd:YAG laser. Although considerable progress has been made in the growth of high quality luminescent diode materials, the maximum power efficiency for either is currently 6 to 15 percent. Unfortunately, the output power currently available from these devices is low. In addition, thermal limitations arise from the high power density in the diodes which in turn places a limit on the number of devices that can be mounted on or near the laser cavity for such pumping. Thus, a limitation on the applicability of diode pump Nd:YAG lasers to space optical communications arises from the problem of providing sufficient optical power from the pumping diodes to the laser rod.

SUMMARY OF THE INVENTION

The present invention is directed to a laser pumping system which uses optic fibers to substantially increase the packing density of pumping diodes. The invention includes a source of pumping energy such as an array of light emitting diodes or injection lasers to which an optic fiber combiner may be coupled for concentrating the pumping energy on the lasing medium. The optic combiner for this laser pumping scheme consists of a number of elements which are composed of a plurality of individual optic fibers at one end which converge to a single fiber at the other end. This construction permits the ouput of a large number of pumping sources located remote to the laser cavity to be concentrated and applied to the laser cavity so as to provide a substantial power density at the laser cavity without thermal limitations caused by the individual diodes packed closedly together.

DESCRIPTION OF THE INVENTION

Figure 1:
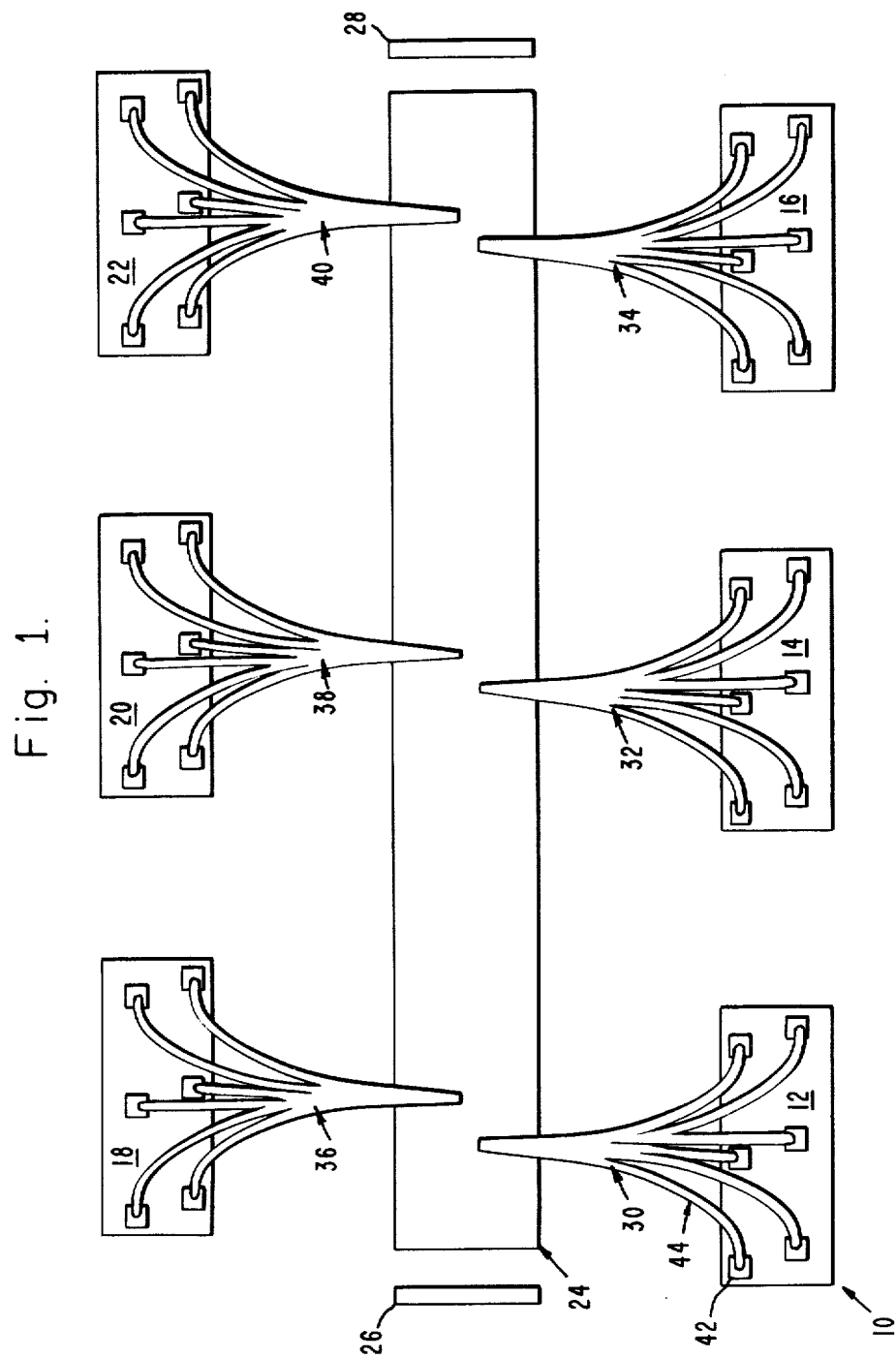
FIG. 1 shows an illustrative embodiment of the present invention.

In FIG. 1 there is shown a laser 10 including diode arrays 12 through 22, a lasing rod 24, mirrors 26 and 28 and optic links 30 through 40 which are described more fully below.

In the preferred embodiment, the lasing rod 24 is a Nd:YAG solid state laser. It should be noted that the invention is not limited to any particular lasing medium and that one of ordinary skill in the art would be able to use the present invention to secure the advantages thereof with any suitable lasing medium.

The optical feedback resonator for the lasing medium is provided by mirrors 26 and 28 which may be designed to suit any particular application. The lasing rod 24 is pumped by diode arrays 12 through 22. The diode arrays may be light emitting diodes or diode lasers and may be configured and arranged to suit the excitations, dissipations and spatial requirements of the intended application without departing from the scope of the invention. The output of each individual diode such as 42 is coupled to a fiber 44 of an optic link such as 30. The outputs of a group of diodes (here 6 diodes) are coupled together by an optic fiber coupling link (e.g. 30) and directed to the lasing rod or medium 24. The emission wavelengths of the diodes are chosen to match the absorption spectrum of the lasing medium.

The optic links are fabricated by removing the outer protective coating or jacket from a few centimeters at the midsection of several lengths of commonly available optic fiber having a numerical aperture, core diameter, and cladding outer diameter as required for the particular application. The fibers are then twisted together at the midsection to make a fiber bundle. Next, the fibers are heated near the center and pulled at the ends by springs, weights, motors or other suitable controllable pulling force. The center of the bundle is heated until the cladding begins to become plastic and semifluid and the bundle begins to stretch at its midsection. As the outer cladding softens, the inner cores also become soft and stretch with the cladding. The longitudinal elongation forms a center area which has a diameter smaller than the original. Finally, the bundle is cut in the middle to provide two optic fiber coupling links.

The heating and stretching of the fibers operates to change their dimensions substantially. In a typical application, the fibers may be initially chosen so as to have a numerical aperture in a range from 0.05 to 0.2 and a cladding diameter of 125 microns and a core diameter of 60 microns. After thermally induced elongation, narrowing of the midsection and separation into two pieces, the diameter of the single tip may be as little as 35 microns while the individual cores would be as little as 5 microns. The optic links enable light from a number of diodes to be coupled together to a small area on the lasing medium with little loss.

Figure 2:
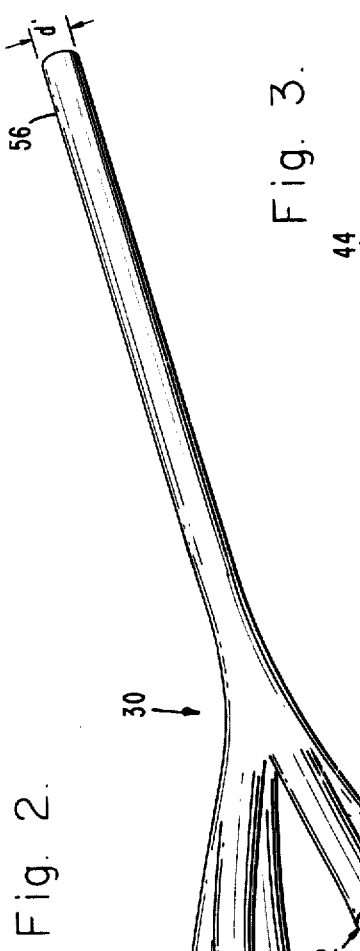
FIG. 2 shows a perspective view of an optic link utilized in the present invention.
Figure 3:
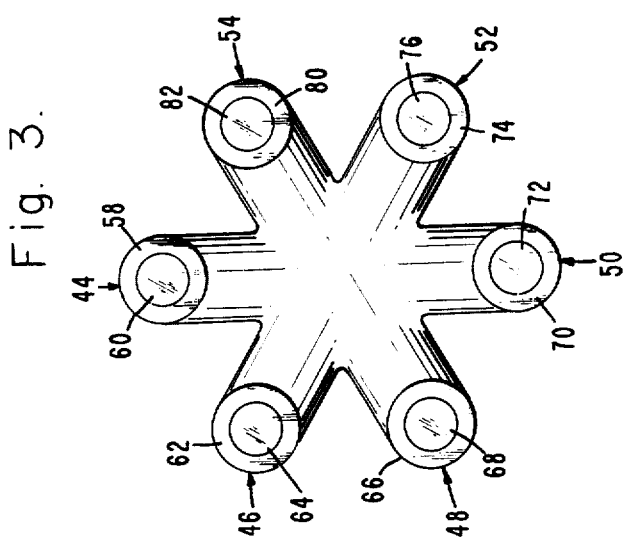
FIG. 3 shows an end view of the optic link utilized in the present invention.
Figure 4:
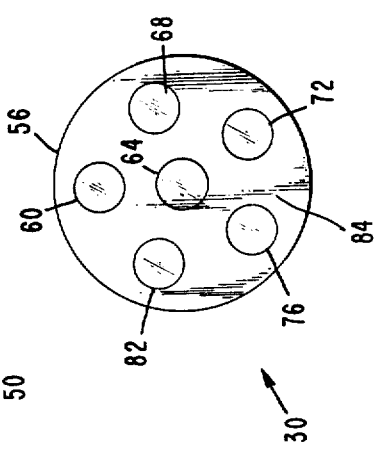
FIG. 4 is another end view of the optic link utilized in the present invention.

Illustrative views of an optic link are shown in FIGS. 2, 3 and 4. The link 30 has at one end a plurality of input fibers 44 through 54 and at the other end a single output fiber 56. The individual optic fiber input diameter d may be equal to or larger than the single output fiber diameter d' of the optic fiber coupling link. The end view of FIG. 3 shows each input fiber to have a cladding as at 58 and a core as at 60. The output aperture 56 is shown as having cores 60, 64, 68 72, 76 and 82 intact and surrounded by a common cladding 84. Optic links with a single stepped index or gradient index core may be utilized without departing from the scope of the present invention.

If there are N diodes which may be coupled by a single coupling link, and there are m coupling links then light from M equal to N times m diodes may be coupled to the lasing rod. In a typical application, a single optical link or coupler has an output diameter d' of approximately 35 to 125 micrometers. Assuming a normal spacing of approximately 125 micrometers between combiner outputs at the lasing rod, a tip diameter of say 100 micrometers and a 30 millimeter rod, more than 120 optic fiber links could be used. The resulting effective diode density can be as much as an order of magnitude larger than that available in conventional diode pump lasers since 120 times N diodes may be coupled to the lasing medium. Further, it is envisioned that the number of diodes per individual optic link could be larger than 20, possibly 100 or more. In addition, the effective packing density of diodes may be increased by reducing the output tip diameter d' of the optic link below 100 micrometers. In this manner, the number of optic links which may be placed along the lasing medium is increased thereby increasing the available excitation energy.

While the present invention has been described herein with reference to a particular embodiment, it is to be understood that the invention is not limited thereto. As mentioned above, those having ordinary skill in the art will recognize that a variety of pumping sources may be employed within the teachings of the present invention to increase the excitation energy delivered to the lasing medium. The optic fibers may be arranged in any number of alternative designs to further increase the packing density.

The present invention provides a reliable pumping scheme in that the diodes may be operated independently resulting in greater reliability and longer life for the laser system. In addition, since N diodes may be coupled to m optic fibers, less than N diodes may be operated at any one time. This would leave the remainder of the diodes as redundant diodes which can be operated should some of the initial pumping diodes fail. In this manner, the concept has inherent long life and reliability as required for space devices. It is contemplated by the appending claims to cover any and all modifications within the scope of the present invention.

What is claimed is:

1. A laser pumping system for applying radiant electromagnetic energy to a lasing medium, said system comprising:
   a plurality of sources of radiant electromagnetic energy; and
   an optic tank for concentrating said radiant electromagnetic energy on a lasing medium; said optic link having a plurality of individual optic fibers at a proximal end thereof with each optical fiber being operably coupled to respective ones of said sources, and wherein said plurality converges longitudinally and continually to a single fiber at a distant end such that substantially all radiant electromagnetic energy which passes through said individual fibers passes through said single fiber to a predetermined area of said active medium.

2. The laser pumping system of claim 1 wherein said source includes a plurality of light emitting diodes.

3. The laser pumping system of claim 1 wherein said source includes a plurality of diode lasers.

* * * * *